United States Patent
Lee (10) Patent No.: US 9,130,808 B2
(45) Date of Patent: Sep. 8, 2015

(54) APPARATUS AND METHOD FOR COMMUNICATION USING NEAR GOLAY SEQUENCE

(75) Inventor: Hee-kwan Lee, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 834 days.

(21) Appl. No.: 12/677,885

(22) PCT Filed: Sep. 12, 2008

(86) PCT No.: PCT/KR2008/005438
§ 371 (c)(1),
(2), (4) Date: Mar. 12, 2010

(87) PCT Pub. No.: WO2009/035306
PCT Pub. Date: Mar. 19, 2009

(65) Prior Publication Data
US 2010/0254488 A1    Oct. 7, 2010

(30) Foreign Application Priority Data

Sep. 14, 2007 (KR) .................. 10-2007-0093862

(51) Int. Cl.
*H04L 27/36* (2006.01)
*H04L 27/26* (2006.01)
(Continued)

(52) U.S. Cl.
CPC ......... *H04L 27/2617* (2013.01); *H03M 13/136* (2013.01); *H03M 13/1505* (2013.01);
(Continued)

(58) Field of Classification Search
CPC .......... H03M 13/136; H03M 13/1505; H03M 13/0014; H03M 13/10
USPC ............................ 375/298, 295, 316; 714/752
See application file for complete search history.

(56) References Cited

U.S. PATENT DOCUMENTS 6,373,859 B1 * 4/2002 Jedwab et al. ............... 370/479
6,967,598 B2   11/2005 Mills
(Continued)

FOREIGN PATENT DOCUMENTS

| KR | 10-2004-0048547 | 6/2004 |
| KR | 10-2004-0074325 | 8/2004 |
| KR | 10-2007-0070486 | 7/2007 |

OTHER PUBLICATIONS

James A. Davis and Jonathan Jedwab; "Peak-to-Mean Power Control in OFDM, Golay Complementary Sequences and Reed-Muller Codes"; Nov. 1999. IEEE, vol. 45, No. 7.*
Lee et al.;"A new construction of 64-QAM Golay Complementary Sequences"; Apr. 2006; IEEE, vol. 52, No. 4.*
Yves Louet and Annick Le Glaunec:"Peak-Factor reduction in O.F.D.M. by Reed-Muller channel coding: a new soft decision decoding algorithm"; 10th Mediterranean Electrotechnical Conference, MEleCon 2000, vol. II, IEEE, 2000. (p. 872-875).*
(Continued)

*Primary Examiner* — Brian T Pendleton
*Assistant Examiner* — Alan Luong
(74) *Attorney, Agent, or Firm* — NSIP Law (57) ABSTRACT

A communication system and method using a Golay sequence, are provided. In the communication method, $2^{nd}$ order Reed-Muller coding is performed on data to generate a codeword, and exponential modulation is performed on the codeword to generate a near Golay complementary sequence. Factors for generating the codeword are permutations of a $1^{st}$ order Reed-Muller generator, and cosets and offsets of a $2^{nd}$ order Reed-Muller code calculated based on the permutations of the $1^{st}$ order Reed-Muller generator, etc.

20 Claims, 8 Drawing Sheets

(51) Int. Cl.
*H03M 13/13* (2006.01)
*H03M 13/15* (2006.01)
*H04J 13/00* (2011.01)
*H04J 13/10* (2011.01)
*H04L 1/00* (2006.01)
*H04L 27/34* (2006.01)

(52) U.S. Cl.
CPC ............ *H04J13/0014* (2013.01); *H04J 13/10* (2013.01); *H04L 1/0042* (2013.01); *H04L 1/0057* (2013.01); *H04L 27/2604* (2013.01); *H04L 27/3416* (2013.01); *H04L 27/3488* (2013.01)

(56) References Cited

U.S. PATENT DOCUMENTS

| | | | |
|---|---|---|---|
| 7,289,588 B2 | 10/2007 | Suh et al. | |
| 2003/0031122 A1* | 2/2003 | Kim et al. | 370/209 |
| 2006/0250936 A1 | 11/2006 | Chen et al. | |
| 2006/0262714 A1 | 11/2006 | Tarokh et al. | |
| 2007/0121483 A1 | 5/2007 | Zhang et al. | |
| 2008/0112501 A1* | 5/2008 | Diaz Fuente et al. | 375/285 |
| 2009/0042511 A1* | 2/2009 | Malladi | 455/62 |
| 2009/0199067 A1* | 8/2009 | Oh et al. | 714/752 |

OTHER PUBLICATIONS

James A. Davis, et al, "Peak-to-Mean Power Control in OFDM, Golay Complementary Sequences, and Reed-Muller Codes," IEEE Transactions on Information Theory, Nov. 1999, pp. 2397-2417, vol. 45 No. 7.

H.R. Sadjadpour, "Construction of non-square M-QAM sequences with low PMEPR for OFDM systems," IEE Proceedings—Communications, Feb. 2004, pp. 20-24, vol. 151 Issue 1.

Heekwan Lee, et al, "A New Construction of 64-QAM Golay Complementary Sequences," IEEE Transactions on Information Theory, Apr. 2006, pp. 1663-1670, vol. 52 Issue 4.

Heekwan Lee, et al, "A New Construction of 16-QAM Near Complementary Sequences," ISIT 2008, Jul. 6-11, 2008, pp. 2772-2776, Toronto, ON, Canada.

Chan Vee Chong, et al, "A New Construction of 16-QAM Golay Complementary Sequences," IEEE Transactions on Information Theory, Nov. 2003, pp. 2953-2959, vol. 49 No. 11.

International Search Report for PCT/KR2008/005438.

Korean Office Action issued on Jul. 28, 2014 in counterpart Korean Application No. 10-2008-0090426 (2 Pages in English, 4 Pages in Korean).

\* cited by examiner

APPARATUS AND METHOD FOR COMMUNICATION USING NEAR GOLAY SEQUENCE

CROSS-REFERENCE TO RELATED APPLICATION(S)

This application is a U.S. national stage application under 35 USC 371 of International Application PCT/KR2008/005438, filed on Sep. 12, 2008, which claims the benefit of Korean Patent Application No. 10-2007-0093862, filed on Sep. 14, 2007, in the Korean Intellectual Property Office, the entire disclosures of which are both incorporated herein by reference for all purposes.

BACKGROUND

1. Field

The following description is related to a communication apparatus using Golay sequences and a data transmission/reception method thereof.

2. Description of Related Art

In an Orthogonal Frequency Division Multiplexing (OFDM) communication system, because a data stream is truncated to a plurality of sub data streams and the sub data streams are transmitted in parallel through sub-carriers, frequency selective fading and narrow-band interference can be alleviated. Thus, a large amount of data may be transmitted through sub-carriers.

Because an OFDM communication system has excellent performance in multipath and mobile communication environments, it has been used in wireless local area networks (WLANs), in wireless communication systems for digital broadcasts, and the like.

However, the OFDM communication system has several disadvantages. For example, a peak to average power ratio (PAPR) or peak-to-mean envelope power ratio (PMEPR) may be relatively high due to successive combinations of sub channels. The PAPR corresponds to a ratio of peak to average power ratio of multicarriers, and signals having a high PAPR deteriorate the power efficiency of an amplifier and hinder the orthogonality of data modulated by the sub carriers, resulting in reduced transmission efficiency.

Representative methods for reducing the PAPR include a method for clipping a part of a signal where the peak power appears through a filter, a method of multiplying codewords by weights for lowering the peak value for each region, and the like.

However, in the example of the clipping method, because some parts of signals are truncated, the signals may be distorted or out-of-band frequency characteristics may deteriorate. Also, in the example of the method of multiplying the codewords by the weights, because the weights have to be calculated for each region, additional pre-processing is needed and also there is inefficiency of having to transmit the calculated weights to a receiver.

Furthermore, because codewords are random, the above-described methods have a disadvantage in that PAPR reduction is not sufficient although the generation possibility of data distortion is reduced statistically.

SUMMARY

Other features and aspects may be apparent from the following description, the drawings, and the claims.

BRIEF DESCRIPTION OF DRAWINGS

Throughout the drawings and the description, unless otherwise described, the same drawing reference numerals should be understood to refer to the same elements, features, and structures. The relative size and depiction of these elements may be exaggerated for clarity, illustration, and convenience.

DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

Figure 1:
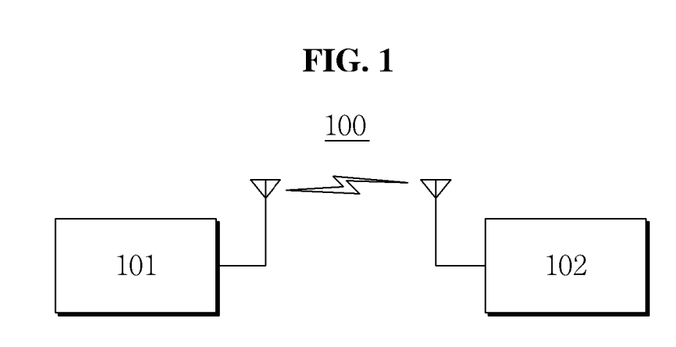
FIG. 1 is a diagram illustrating an example of a communication system.

FIG. 1 illustrates an example of a communication system.

Referring to the example shown in FIG. 1, the communication system 100 includes a transmitter 101 and a receiver 102. The transmitter 101 may be included in a terminal, a base station, and the like. Also, the receiver 102 may be included in a terminal, a base station, and the like.

The transmitter 101 modulates data and transmits the modulated data to the receiver 102, and the receiver 102 demodulates the modulated data and restores the original data. A communication method used by the transmitter 101 and receiver 102 may be, for example, an M-level quadrature amplitude modulation (M-QAM) method, where 'M' is a value defined as $2^{2n}$, and where 'n' is a whole number.

The transmitter 101 may generate signals in the form of Golay sequences. Such Golay sequences may be generated by performing $2^{nd}$ order Reed-Muller coding on data to generate codewords and performing exponential modulation on the codewords.

The receiver 102 receives signals in the form of Golay sequences, extracts codewords from the Golay sequences, and restores data from the codewords.

Figure 2:
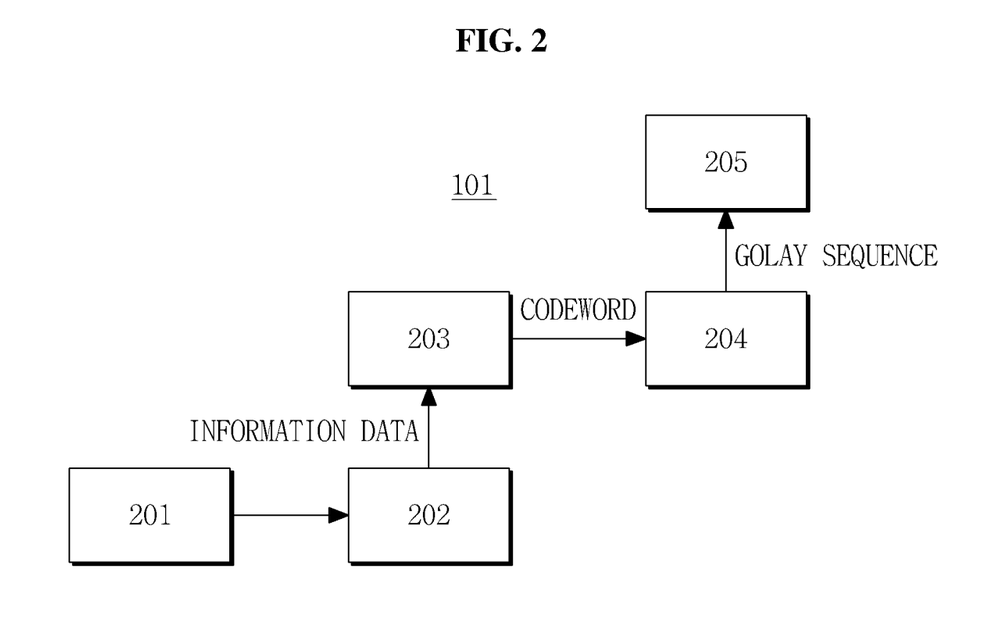
FIG. 2 is a diagram illustrating an example of a transmitter.

FIG. 2 illustrates an example of a transmitter.

Referring to the example shown in FIG. 2, the transmitter 101 includes a transducer 201, an analog-digital converter 202, an encoder 203, a modulator 204, and a transmitting unit 205.

Data from the transducer 201 is converted into a digital signal via the analog-digital converter 202. The data converted into the digital signal is coded by the encoder 203. That is, the encoder 203 generates codewords corresponding to the data. The codewords are input to the modulator 204, and the modulator 204 modulates the codewords and generates a modulation signal. The modulation signal is transmitted to the receiver 102 (see FIG. 1) by the transmitting unit 205.

Referring to FIG. 2, the encoder 203 may generate the codewords by performing $2^{nd}$ order Reed-Muller coding on the data. Also, cosets and offsets of the $2^{nd}$ order Reed-Muller coding may be calculated based on permutations of the $1^{st}$ order Reed-Muller generator. The encoder 203 may generate the codewords using a $1^{st}$ order Reed-Muller generator, and may generate the codeword using cosets and offsets of $2^{nd}$ order Reed-Muller codes that are calculated based on permutations of the $1^{st}$ order Reed-Muller generator.

Also, the offsets of the $2^{nd}$ order Reed-Muller codes calculated based on the permutations of the $1^{st}$ order Reed-Muller generator may be linear or non-linear offsets.

The linear offsets may be generated by linearly combining permutations of the generator vectors of specific $1^{st}$ order Reed-Muller codes and specific linear combination of the permutations. That is, the linear offsets may be generated by linearly combining the permutations for the $1^{st}$ order Reed-Muller generator. Also, the linear offsets may be a monoid.

By generating the codewords using the linear offsets, grouping the codewords to several symbol groups according to a predetermined modulation method, and performing exponential modulation on the symbol groups, each symbol group will consist of a series of symbols having a constant length that becomes a near Golay sequence, and the PAPR of transmission signals may be reduced.

Nonlinear offsets may be generated by nonlinearly combining the permutations of the $1^{st}$ order Reed-Muller generator. For example, the nonlinear offsets may be generated by linearly combining specific $1^{st}$ order Reed-Muller generator vectors, linearly combining different $1^{st}$ order Reed-Muller code generator vectors, and multiplying or adding the linear combinations of the $1^{st}$ order Reed-Muller generator vectors.

By generating codewords using nonlinear offsets and performing exponential modulation on the codewords to thus generate Golay sequences, a large number of Golay sequences may be generated and the code rate may be increased.

From a mathematical point of view, this process combines generator vectors for generating codewords so that there are QAM sequences having aperiodic autocorrelation functions with opposite polarities. For example, if aperiodic autocorrelation functions obtained after exponential modulation are +3, −2, +7, the inverse polarities of the aperiodic autocorrelation functions will be −3, +2, −7. That is, various generators may be generated using linear transform through permutations and linear combinations described above, linear transform (for example, x−>ax+b) on permutations of the $1^{st}$ order Reed-Muller generator, the product of linear transforms on permutations of different generator vectors, and/or nonlinear transform through permutations of specific $1^{st}$ order Reed-Muller codes and linear combinations of the permutations.

The modulator 204 generates a near Golay complementary sequence whose exponents are the codewords generated by the encoder 203. When there are QAM sequences having the same length and whose aperiodic autocorrelation functions have opposite polarities, the QAM sequences correspond to Golay sequences. Near Golay complementary sequences correspond to two sequences whose polarities are nearly inverse.

The Golay sequences generated in this manner may be used to reduce the PAPR in a QAM communication method, or used as signature sequences in CDMA.

Also, Golay sequences may be used in a transmission/reception technology between a terminal and base station based on the pico/femto cell scenario which corresponds to next generation communication technology.

The operation of the encoder 203 and modulator 204 are described below using the following example equations.

In this example, a process of generating a 64-QAM Golay sequence is described below.

The encoder 203 may generate codewords $A(\underline{x})$, $a(\underline{x})$, and $\alpha(\underline{x})$ for received data, as shown in Equation (1).

$$A(\underline{x}) = 2\Sigma_{k=1}^{m-1} x_{\pi(k)} x_{\pi(k+1)} + \Sigma_{k=1}^{m} c_k x_k + c$$

$$a(\underline{x}) = A(\underline{x}) + (s^{(1)}(\underline{x}))$$

$$\alpha(\underline{x}) = A(\underline{x}) + (s^{(2)}(\underline{x})) \qquad (1)$$

Referring to Equation (1), C, $C_k$ represents the information data, x represents a $1^{st}$ order Reed-Muller generator, π represents permutation, and m may be set to a proper value which determines the length of a codeword (for example, the length of a codeword=$2^m$).

Also, an offset s(x) may be one of the following values and may be a monoid for addition. Examples of offset groups are shown in Equation (2) as follows:

Case I: $\qquad (2)$ $$(s^{(1)}(\underline{x}), s^{(2)}(\underline{x})) = (d_0 + d_1 x_{\pi(1)}, d_0' + d_1' x_{\pi(1)});$$

Case II:

$$(s^{(1)}(\underline{x}), s^{(2)}(\underline{x})) = (d_0 + d_1 x_{\pi(m)}, d_0' + d_1' x_{\pi(m)});$$

Case III:

$(s^{(1)}(\underline{x}), s^{(2)}(\underline{x})) =$ $$(d_0 + d_1 x_{\pi(w)} + d_2 x_{\pi(w+1)}, \leq d_0' + d_1' x_{\pi(w)} + d_2' x_{\pi(w+1)})$$

with $2d_0 + d_1 + d_2 = 0,$ $2d_0' + d_1' + d_2' = 0,$ $2 \leq w \leq m - 1;$

; and

Case V:

$(s^{(1)}(\underline{x}), s^{(2)}(\underline{x})) = (d_0 + d_1 x_{\pi(m-1)} + d_2 x_{\pi(m)}, d_0' + d_1' x_{\pi(m)}),$ with $2d_0 + d_1 + d_2 = 0,$ $2d_0' + d_1' = 0.$ The modulator 204 performs exponential modulation on the codewords $A(\underline{x})$, $a(\underline{x})$, and $\alpha(\underline{x})$, generated from Equation (1), and generates a sequence $C_i$ as shown in Equation (3).

$$C_i = \gamma[r_1 \xi^{A_i} + r_2 \xi^{a_i} + r_3 \xi^{\alpha_i}] \qquad (3)$$

where $$r_1 = \frac{4}{\sqrt{21}}, r_2 = \frac{2}{\sqrt{21}}, r_3 = \frac{1}{\sqrt{21}}, \xi = e^{j\pi/2}, \gamma = e^{j\pi/4}$$

Figure 9:
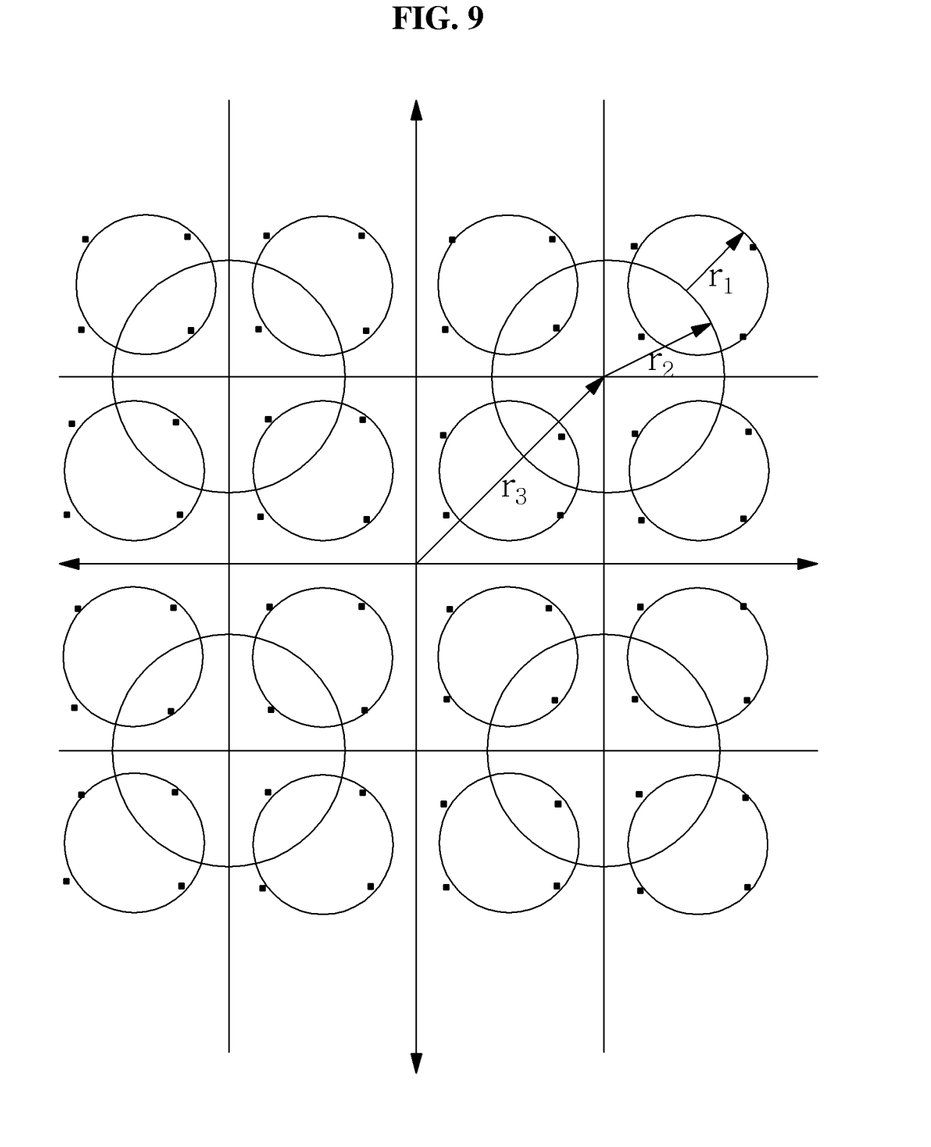
FIG. 9 is a diagram illustrating an example of the constellation of 64-QAM sequences.

FIG. 9 illustrates an example of the constellation of 64-QAM sequences generated in the above-described manner, wherein coefficients constructing each 64-QAM sequence are positioned symmetrically so that they may be used as a 64-QAM signal in an Orthogonal Frequency Division Multiplexing (OFDM) communication system.

The above-described embodiment corresponds to the case of generating 64-QAM Golay sequences, but generating M-QAM (M>64) Golay sequences is also possible (for example, M=$2^{2n}$).

In this example, the encoder 203 generates three or more codewords. If codewords are assumed to be $y^{(1)}(\underline{x})$ through $y^{(n)}(\underline{x})$, they may be represented as shown in Equation (4).

$$y^{(1)}(\underline{x}) = 2\sum_{k=1}^{m-1} x_{\pi(k)}x_{\pi(k+1)} + \sum_{k=1}^{m} c_k x_k + c \quad (4)$$

$$y^{(2)}(\underline{x}) = y^{(1)}(\underline{x}) + (s^{(1)}(\underline{x}))$$

$$y^{(3)}(\underline{x}) = y^{(1)}(\underline{x}) + (s^{(2)}(\underline{x}))$$

$$\ldots$$

$$y^{(n)}(\underline{x}) = y^{(1)}(\underline{x}) + (s^{(n-1)}(\underline{x}))$$

In the example where a M-QAM (M>64) Golay sequence is generated, offsets $S^{(1)}(\underline{x}), s^{(2)}(\underline{x}), \ldots, S^{(n-1)}(\underline{x})$ used for generating codewords may be generated by selecting a part of the offsets represented by Equation (4) and combining the selected offsets. For example, in Equation (4), $y^{(4)}(\underline{x})$ is a sum of the first codeword $y^{(1)}(\underline{x})$ and $s^{(3)}(\underline{x})$. For example, if offset group Case I is selected from among the offset groups of Case I through Case V shown in Equation (2), $s^{(3)}(\underline{x})$ may be one of $d_0 + d_1 x_{\pi(1)}$ and $d'_0 + d'_1 x_{\pi(1)}$.

Also, if n codewords are generated as described above, the modulator 204 may generate a Golay sequence according to the following Equation (5).

$$C_i = \gamma \left[ r_1^{(2^{2n})} \xi^{y_i^{(1)}} + r_2^{(2^{2n})} \xi^{y_i^{(2)}} + r_3^{(2^{2n})} \xi^{y_i^{(3)}} + \ldots + r_n^{(2^{2n})} \xi^{y_i^{(n)}} \right] \quad (5)$$

where $$\xi = e^{j\pi/2}, \gamma = e^{j\pi/4}, r_i = \frac{(2)^{i-1}}{\sqrt{\sum_{i=0}^{n=1} 2^{2i}}}$$

The method described above with reference to Equations (1) through (5) corresponds to the example of generating a Golay sequence using linear offsets, but generating Golay sequences using nonlinear offsets is also possible.

For example, when a 16-QAM near Golay sequence is generated using nonlinear offsets, the encoder 203 may generate codewords $A(\underline{x})$ and $\alpha(\underline{x})$ as shown in Equation (6).

$$A(\underline{x}) = 2\sum_{l=0}^{m-2} x_{\pi(l)} x_{\pi(l+1)} + \sum_{l=0}^{m-1} c_l x_{\pi(l)} + c, \quad (6)$$

$$\alpha(\underline{x}) = A(\underline{x}) + a(x_{\pi(0)}, x_{\pi(1)})(1 - x_{\pi(k)}) +$$

$$b(x_{\pi(0)}, x_{\pi(1)}) x_{\pi(k)} - 2 \sum_{l=0}^{k-1} x_{\pi(l)} x_{\pi(l+1)} + 1$$

In the codeword $\alpha(x)$ of Equation (6), the remaining terms, except for the term $A(\underline{x})$, correspond to offsets. In this example, the offsets are made by nonlinear combinations of the permutations of the $1^{st}$ order Reed-Muller generator.

For example, the nonlinear offsets used in Equation (6) may be expressed as shown in Equation (7).

$$a(x_{\pi(0)}, x_{\pi(1)}) = 2x_{\pi(0)} x_{\pi(1)}$$

$$b(x_{\pi(0)}, x_{\pi(1)}) = 2x_{\pi(0)} x_{\pi(1)} + 2x_{\pi(0)} + 2x_{\pi(1)} \quad (7)$$

Also, the modulator 204 may generate the following Golay sequence as shown in Equation (8), by performing exponential modulation on the codewords $A(\underline{x})$ and $\alpha(\underline{x})$ represented by Equation (6).

$$C_i = \gamma(r_1 \xi^{A_i} + r_2 \xi^{\alpha_i}), \text{ where} \quad (8)$$

$r_1, r_2$ are elements of the set $R$, $\gamma = e^{\frac{j\pi}{4}}, \xi = e^{\frac{j\pi}{2}}$ As seen in Equation (8), by performing $2^{nd}$ order Reed-Muller coding on information data to generate codewords, and performing exponential modulation on the codewords to generate a Golay sequence optimized for a predetermined modulation method, the peak power of signals may be reduced and errors appearing as noise in communication channels may be corrected based on the use of error correction codes. In addition, due to the use of nonlinear offsets, a code rate may also be improved.

Figure 3:
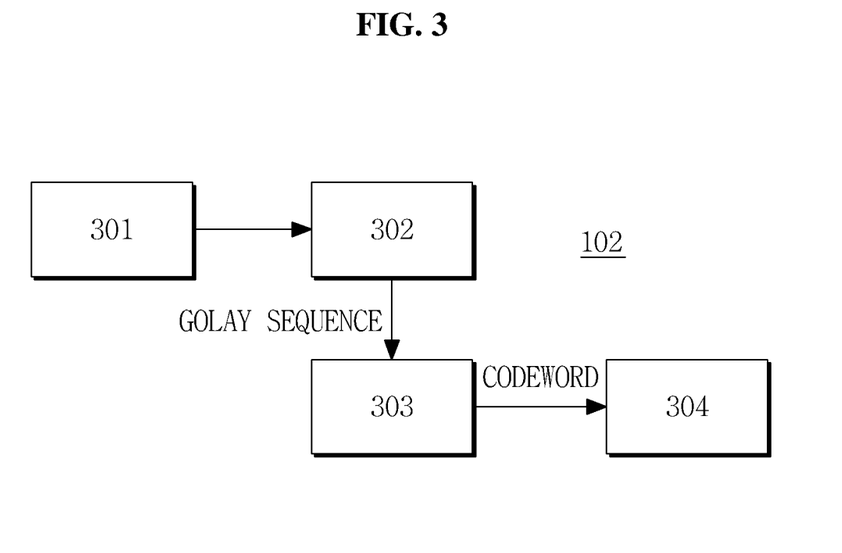
FIG. 3 is a diagram illustrating an example of a receiver.

FIG. 3 illustrates an example of a receiver.

Referring to FIG. 3, the receiver 102 includes a tuner 301, a digital-analog converter 302, a demodulator 303, and a decoder 304.

For example, a signal transmitted from the transmitter 101 (see FIG. 2) is received by the tuner 301 and then passes through the digital-analog converter 302, thereby restoring a Golay sequence which has been generated by the transmitter 101. The Golay sequence was created by performing exponential modulation on codewords, and the codewords may be extracted from the Golay sequence by the demodulator 303. The extracted codewords are input to the decoder 304, and the decoder 304 restores original data from the codewords.

In FIG. 3, the demodulator 303 and decoder 304 respectively correspond to the modulator 204 and encoder 203 illustrated in FIG. 2. For example, the demodulator 303 and decoder 304 can perform the reverse processes of coding and modulating described above with reference to FIG. 2.

For example, the decoder 304 may restore data using a parity matrix of $2^{nd}$ order Reed-Muller codes or using iterative detection. Also, the demodulator 303 may perform exponential demodulation which is the reverse process of the exponential modulation described above, thereby extracting codewords from the Golay sequence.

Figure 4:
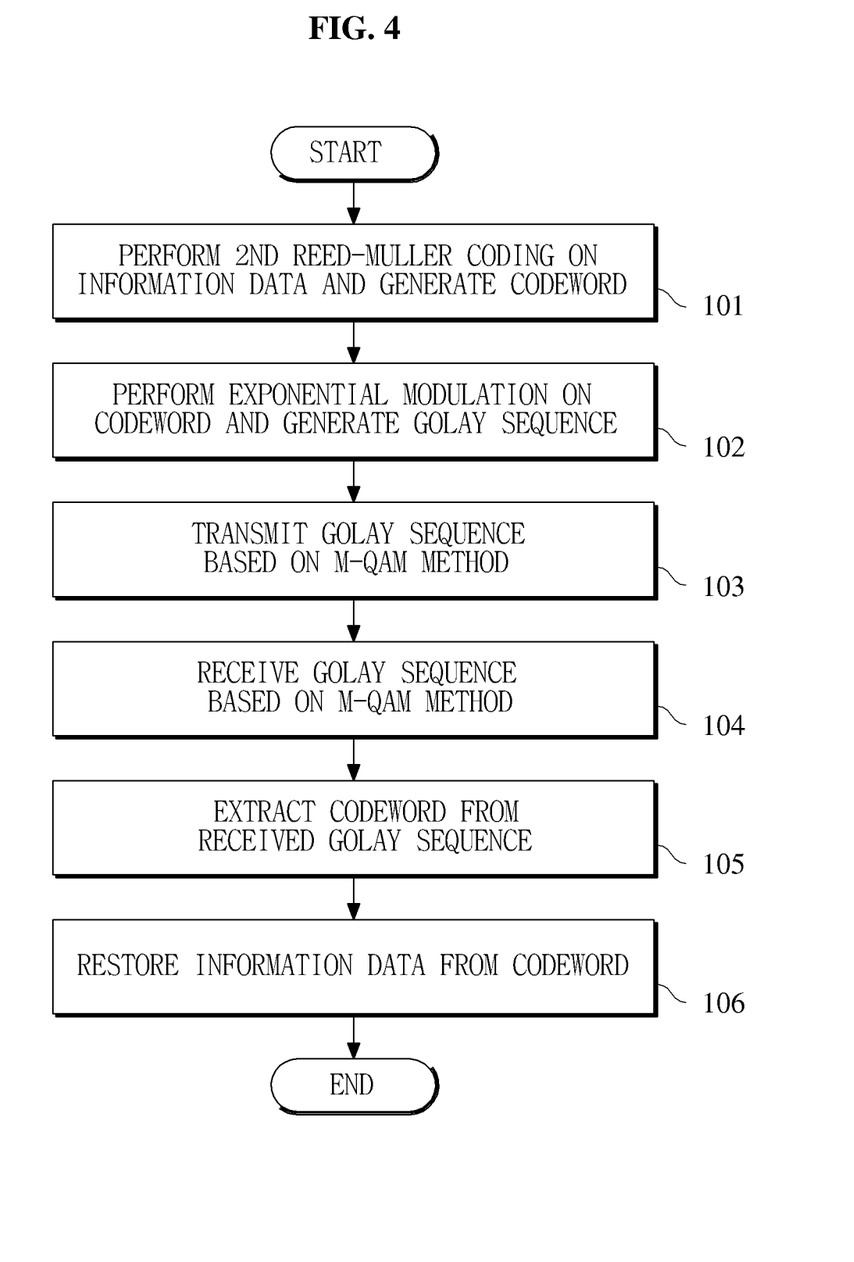
FIG. 4 is a flowchart illustrating an example of a data transmission/reception method.

FIG. 4 illustrates an example of a data transmission/reception method.

Referring to FIG. 4, in 101, $2^{nd}$ order Reed-Muller coding is performed on data, to generate codewords. For example, the codewords may be generated using a $1^{st}$ order Reed-Muller generator, and cosets and offsets of $2^{nd}$ order Reed-Muller codes calculated based on permutations of the $1^{st}$ order Reed-Muller generator. Also, the offsets may be linear offsets which are generated by linearly combining permutations of the $1^{st}$ order Reed-Muller generator, or nonlinear offsets which are generated by nonlinearly combining permutations of the $1^{st}$ order Reed-Muller generator. Examples of the $2^{nd}$ order Reed-Muller coding have been described above with reference to Equations (1), (2), (4), and (6). Also, the offsets may be represented, for example, as shown in Equations (2) and (7).

In 102, by performing exponential modulation on the codewords, a Golay sequence is generated. The Golay sequence may be a near Golay complementary sequence, and details for the exponential modulations may be expressed by the above Equations (3) and (5).

In 103, the Golay sequence is transmitted based on the M-QAM method. 101, 102, and 103 may be performed by a transmitter, for example, the transmitter 101 illustrated in FIG. 2.

In 104, the Golay sequence transmitted based on the M-QAM method is received by a receiver, for example, the receiver 102 illustrated in FIG. 3.

In 105, codewords are extracted from the Golay sequence. For example, by performing exponential demodulation that is the reverse process of operation 102, codewords may be extracted from the Golay sequence.

Finally, in 106, data is restored from the extracted codewords. For example, the data may be restored using a parity matrix of the $2^{nd}$ order Reed-Muller codes or using iterative detection.

104, 105 and 106 may be performed by a receiver, for example, receiver 102 illustrated in FIG. 3.

Figure 5:
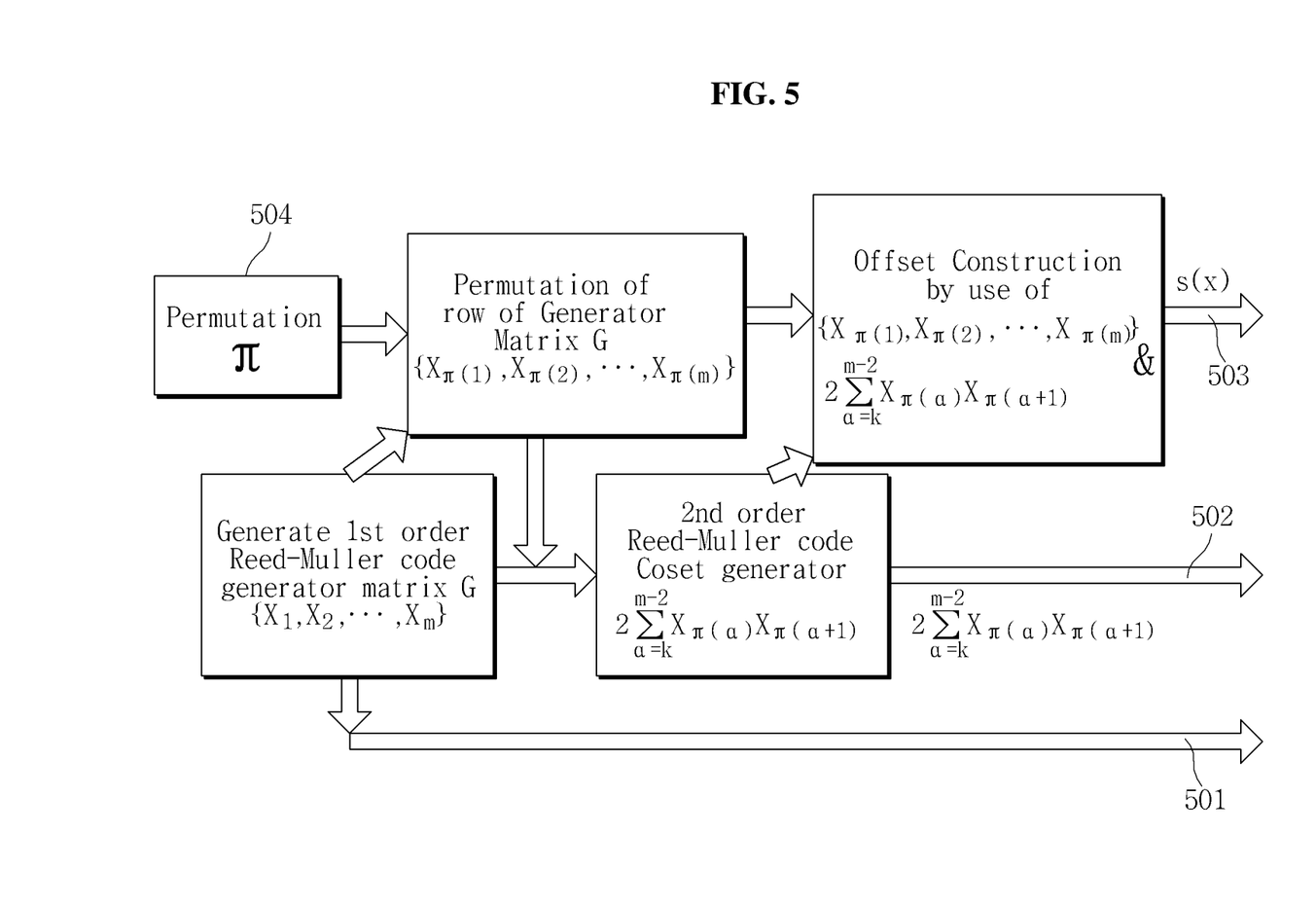
FIG. 5 is a diagram illustrating an example of a process for generating a generator, cosets, and offsets.

FIG. 5 illustrates an example of a process for generating a $1^{st}$ order Reed-Muller generator and cosets and offsets of $2^{nd}$ order Reed-Muller codes, which may be used to generate codewords.

Referring to FIG. 5, the $1^{st}$ order Reed-Muller generator 501, and the cosets 502 and offsets 503 of the $2^{nd}$ order Reed-Muller codes, are used as encoding factors to encode data. Also, the cosets 502 and offsets 503 are obtained using specific permutation 504 of the $1^{st}$ order Reed-Muller generator 501.

The process illustrated in FIG. 5 may be performed by an encoder, for example, the encoder 203 in FIG. 2 which is a pre-processor.

Figure 6:
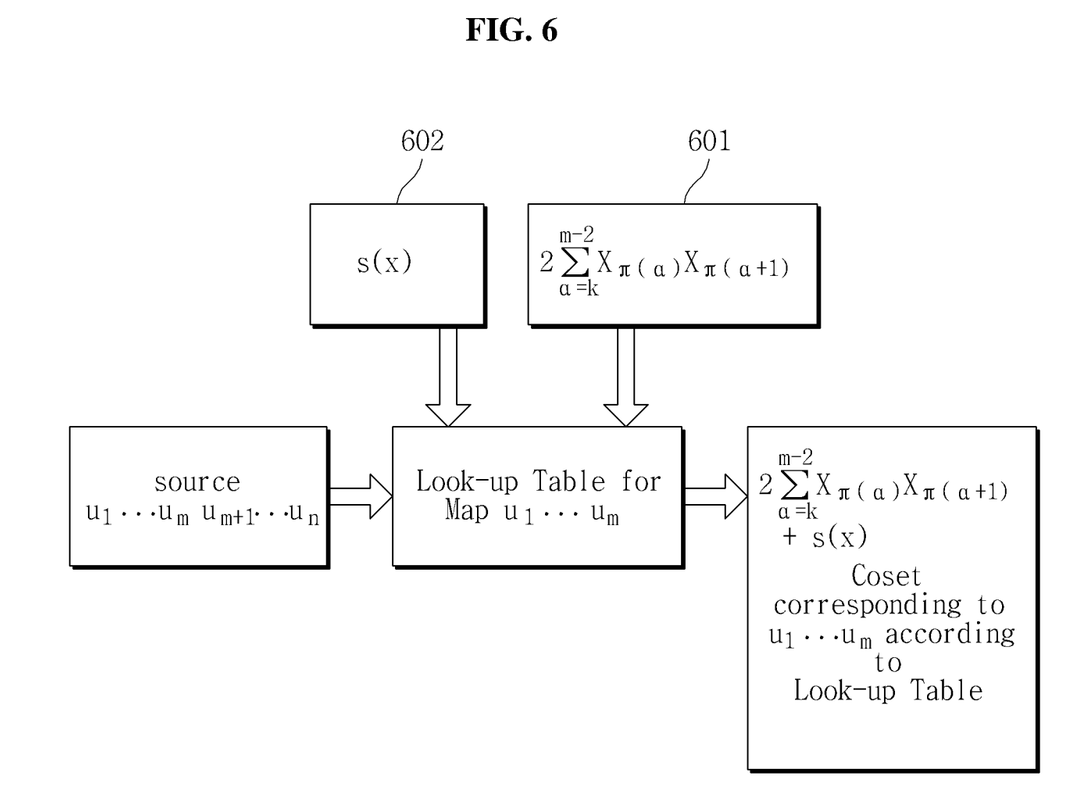
FIG. 6 is a diagram illustrating an example process of coding data.

FIG. 6 illustrates an example process of coding data. FIG. 6 illustrates an example of coding using a lookup table.

In FIG. 6, Source means data. Also, reference numbers 601 and 602 respectively represent cosets and offsets generated in the previous process (see FIG. 5). For example, if data is $U_1U_2\ldots U_mU_{m+1}\ldots U_n$, data $U_1\ldots U_m$ may be taken from the data $U_1U_2\ldots U_mU_{m+1}\ldots U_n$ and mapped to a sum of the to of the corresponding $2^{nd}$ order Reed-Muller coset and offset s(x).

In FIG. 6, k corresponds to the number of the cosets 601 and offsets 602. Also, m is the integer part of a value obtained by taking the log of the value k.

Figure 7:
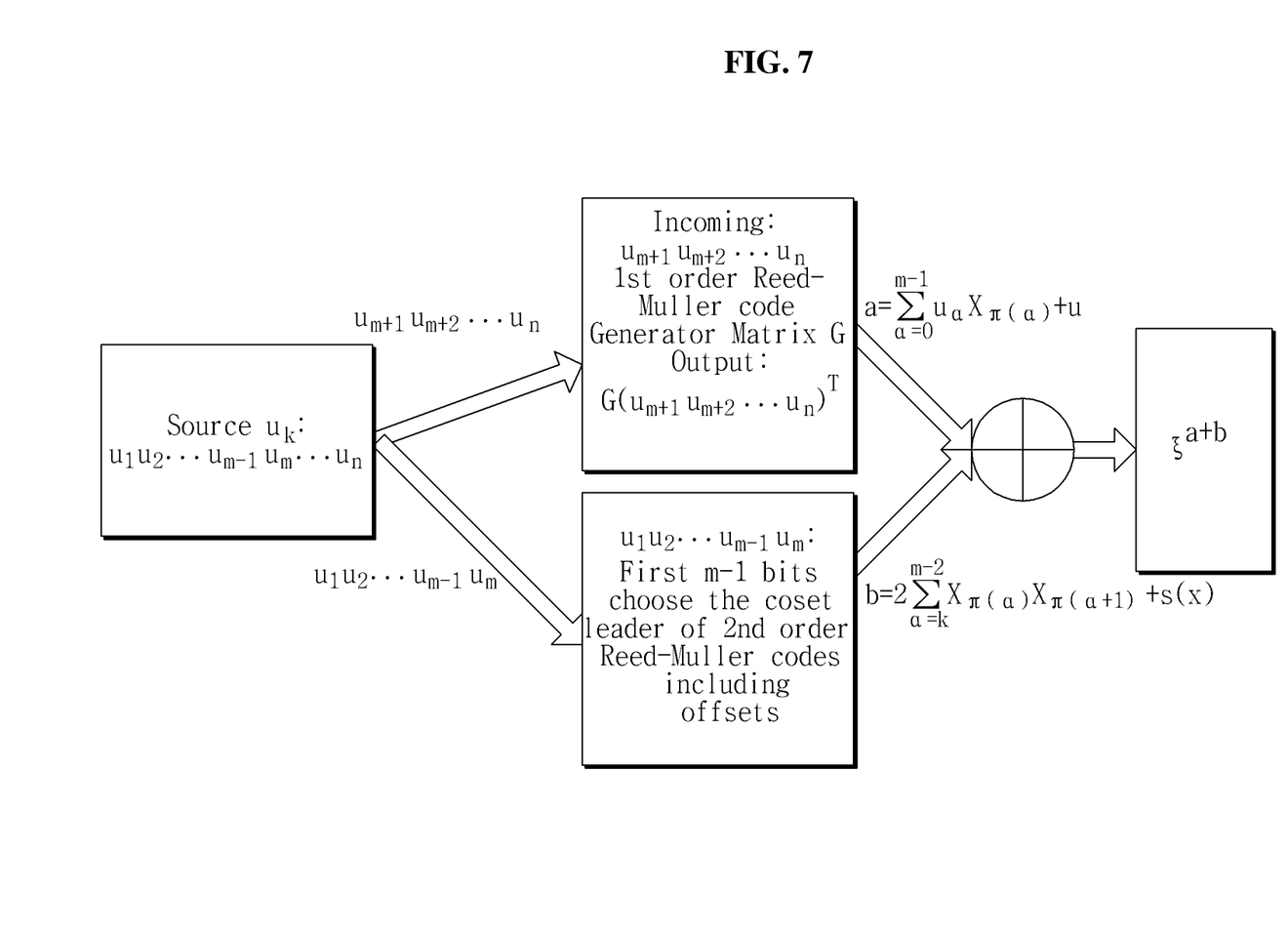
FIG. 7 is a diagram illustrating an example of the communication system illustrated in FIG. 1 incorporating a Quadrature Phase Shift Keying (QPSK) scheme.
Figure 8:
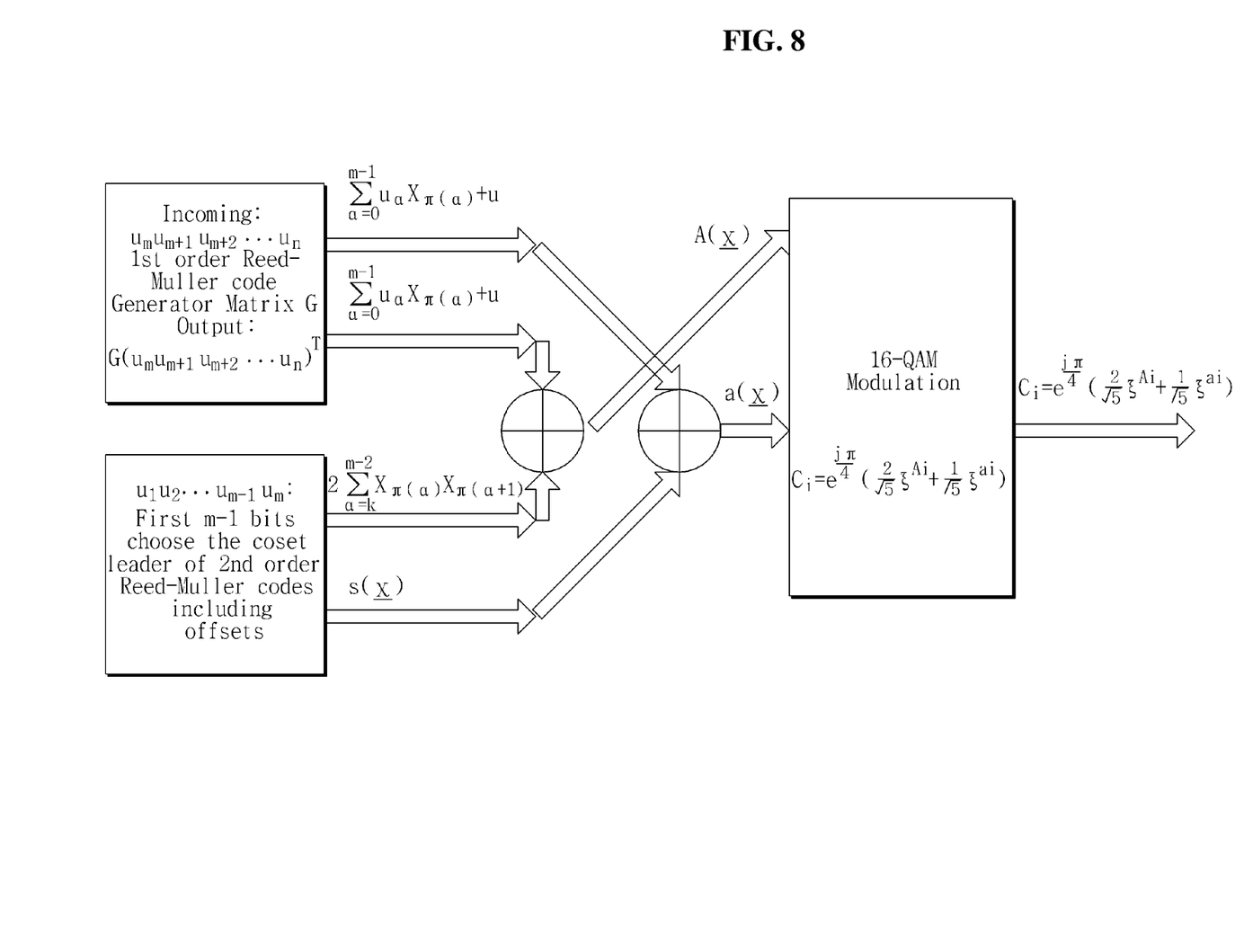
FIG. 8 is a diagram illustrating an example of the communication system illustrated in FIG. 1 incorporating a Quadrature amplitude modulation (QAM) scheme.

FIG. 7 illustrates an example of the communication system illustrated in FIG. 1 incorporating a Quadrature Phase Shift Keying (QPSK) communication scheme, and FIG. 8 illustrates an example of the communication system illustrated in FIG. 1 incorporating a Quadrature amplitude modulation (QAM) communication scheme.

Referring to FIGS. 7 and 8, codewords are created using the cosets and offsets of the $2^{nd}$ order Reed-Muller codes generated from the predetermined combinations of the $1^{st}$ order Reed-Muller generators, and a near Golay sequence is generated by performing exponential modulation on the codewords. Other details for this process have been described above with reference to the related equations, thus, a description thereof is omitted.

Therefore, the methods described herein may be applied to technologies to achieve PAPR reduction, error collection, and a high transmission rate, in a multicarrier communications environment.

The communication system and method described herein may achieve peak to average power ratio (PAPR) reduction, error correction, and a high transmission rate, in a multicarrier communications environment.

A communication apparatus, such as a transmitter, may include an encoder for performing $2^{nd}$ order Reed-Muller coding on data and generating a codeword. The transmitter may also include a modulator for performing exponential modulation on the codeword, thus generating a near Golay complementary sequence.

A communication apparatus, such as a receiver, may use a near Golay sequence, including a demodulator for receiving a signal modulated in a form of a Golay sequence and performing exponential demodulation on the received signal, thus extracting a codeword from the Golay sequence. The receiver may also include a decoder restoring original information data from the codeword.

According to the above-described examples, because signals modulated in the form of near Golay complementary sequences are used in a communication system, a peak to average power ratio (PAPR) of signals can be reduced. Also, because $2^{nd}$ order Reed-Muller coding is used in modulating signals, error correction is possible. Also, various offsets may be used in generating codewords, and a code rate may be increased in a high-level modulation communications environment.

The methods described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

As a non-exhaustive illustration only, the terminal device described herein may refer to mobile devices such as a cellular phone, a personal digital assistant (PDA), a digital camera, a portable game console, and an MP3 player, a portable/personal multimedia player (PMP), a handheld e-book, a portable lab-top personal computer (PC), a global positioning system (GPS) navigation, and devices such as a desktop PC, a high definition television (HDTV), an optical disc player, a setup box, and the like capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A communication apparatus comprising:
an encoder configured to
generate a coset of a $2^{nd}$ order Reed-Muller code, the coset comprising a summation of nonlinear combinations of permutations of a $1^{st}$ order Reed-Muller generator,
generate nonlinear offsets of the $2^{nd}$ order Reed-Muller code, each of the nonlinear offsets comprising a nonlinear combination of the permutations of the $1^{st}$ order Reed-Muller generator, and
generate a codeword based on the coset and the nonlinear offsets to encode data; and
a modulator configured to perform exponential modulation on the codeword to generate a near Golay complementary sequence.

2. The communication apparatus of claim 1, wherein the encoder is further configured to:
generate a linear offset of the $2^{nd}$ order Reed-Muller code based on the permutations of the $1^{st}$ order Reed-Muller generator; and
generate the codeword based on the coset and the linear offset.

3. The communication apparatus of claim 2, wherein the encoder is further configured to:
linearly combine the permutations of the $1^{st}$ order Reed-Muller generator to generate the linear offset.

4. The communication apparatus of claim 2, wherein the linear offset is a monoid for addition.

5. The communication apparatus of claim 1, wherein the modulator is further configured to:
generate the near Golay complementary sequence based on an M-level quadrature amplitude modulation (M-QAM) method.

6. A communication apparatus using a near Golay sequence, the apparatus comprising:
a demodulator configured to
receive a signal modulated in a form of a Golay sequence, and
perform exponential demodulation on the signal to extract a codeword from the signal; and
a decoder configured to restore original data from the codeword,
wherein the signal is generated by
generating a coset of a $2^{nd}$ order Reed-Muller code, the coset comprising a summation of nonlinear combinations of permutations of a $1^{st}$ order Reed-Muller generator,
generating nonlinear offsets of the $2^{nd}$ order Reed-Muller code, each of the nonlinear offsets comprising a nonlinear combination of the permutations of the $1^{st}$ order Reed-Muller generator, and
generating the codeword based on the coset and the nonlinear offsets to encode the original data.

7. The communication apparatus of claim 6, wherein:
the signal modulated in the form of the Golay sequence is a near Golay complementary sequence; and
the signal is further generated by
generating a linear offset of the $2^{nd}$ order Reed-Muller code based on the permutations of the $1^{st}$ order Reed-Muller generator,
generating the codeword based on the coset and the linear offset, and
performing exponential modulation on the codeword to generate the near Golay complementary sequence.

8. The communication apparatus of claim 6, wherein the decoder is further configured to:
decode the original data based on a parity matrix of the $2^{nd}$ order Reed-Muller code.

9. The communication apparatus of claim 6, wherein the decoder is further configured to:
decode the original data based on iterative detection.

10. A data transmission method comprising:
generating, by using at least one computer processor connected to a transmitter, a coset of a $2^{nd}$ order Reed-Muller code, wherein the coset comprises a summation of nonlinear combinations of permutations of a $1^{st}$ order Reed-Muller generator;
generating, by using the at least one computer processor connected to a transmitter, nonlinear offsets of the $2^{nd}$ order Reed-Muller code, wherein each of the nonlinear offsets comprises a nonlinear combination of the permutations of the $1^{st}$ order Reed-Muller generator;
generating, by using the at least one computer processor connected to a transmitter, a codeword based on the coset and the nonlinear offsets, in order to encode data; and
performing, by using the at least one computer processor connected to a transmitter, exponential modulation on the codeword, in order to generate a near Golay complementary sequence;
transmitting, by using the transmitter, a transmission including the near Golay complementary sequence.

11. The data transmission method of claim 10, further comprising:
generating, by using the at least one computer processor connected to a transmitter, a linear offset of the $2^{nd}$ order Reed-Muller code based on the permutations of the $1^{st}$ order Reed-Muller generator; and
generating, by using the at least one computer processor connected to a transmitter, the codeword based on the coset and the linear offset.

12. The data transmission method of claim 11, further comprising:
linearly combining, by using the at least one computer processor connected to a transmitter, the permutations of the $1^{st}$ order Reed-Muller generator, in order to generate the linear offset.

13. The data transmission method of claim 11, wherein the linear offset is a monoid for addition.

14. The data transmission method of claim 10, wherein the performing of the exponential modulation comprises:
generating, by using the at least one computer processor connected to a transmitter, the near Golay complementary sequence, based on an M-level quadrature amplitude modulation (M-QAM) method.

15. A data receiving method comprising:
receiving a signal modulated in a form of a Golay sequence;
performing exponential demodulation on the signal to extract a codeword from the signal; and
restoring data from the codeword,
wherein the signal is generated by
generating a coset of a $2^{nd}$ order Reed-Muller code, the coset comprising a summation of nonlinear combinations of permutations of a $1^{st}$ order Reed-Muller generator, generating nonlinear offsets of the $2^{nd}$ order Reed-Muller code, each of the nonlinear offsets comprising a nonlinear combination of the permutations of the $1^{st}$ order Reed-Muller generator, and generating the codeword based on the coset and the nonlinear offsets to encode data.

16. The data receiving method of claim 15, wherein:

the signal modulated in the form of the Golay sequence is a near Golay complementary sequence; and the signal is further generated by generating a linear offset of the $2^{nd}$ order Reed-Muller code based on the permutations of the $1^{st}$ order Reed-Muller generator, generating the codeword based on the coset and the linear offset, and performing exponential modulation on the codeword to generate the near Golay complementary sequence.

17. The data receiving method of claim 15, wherein the restoring of the data comprises:

decoding the data based on a parity matrix of the $2^{nd}$ order Reed-Muller code.

18. The data receiving method of claim 15, wherein the restoring of the data comprises:

decoding the data based on iterative detection.

19. The communication apparatus of claim 1, wherein the encoder is further configured to generate the nonlinear offsets based on the following equations:

$$a(x_{\pi(0)}, x_{\pi(1)}) = 2x_{\pi(0)} x_{\pi(1)}$$

$$b(x_{\pi(0)}, x_{\pi(1)}) = 2x_{\pi(0)} x_{\pi(1)} + 2x_{\pi(0)} + 2x_{\pi(1)},$$

wherein a and b denote the nonlinear offsets, and $x_{\pi(0)}$ and $x_{\pi(1)}$ denote the permutations of the $1^{st}$ order Reed-Muller generator.

20. The data transmission method of claim 10, further comprising:

generating, by using the at least one computer processor connected to a transmitter, the nonlinear offsets based on the following equations:

$$a(x_{\pi(0)}, x_{\pi(1)}) = 2x_{\pi(0)} x_{\pi(1)}$$

$$b(x_{\pi(0)}, x_{\pi(1)}) = 2x_{\pi(0)} x_{\pi(1)} + 2x_{\pi(0)} + 2x_{\pi(1)},$$

wherein a and b denote the nonlinear offsets, and $x_{\pi(0)}$ and $x_{\pi(1)}$ denote the permutations of the $1^{st}$ order Reed-Muller generator.

* * * * *